United States Patent [19]

Chung et al.

[11] Patent Number: 5,590,087

[45] Date of Patent: Dec. 31, 1996

[54] MULTI-PORTED DATA STORAGE DEVICE WITH IMPROVED CELL STABILITY

[75] Inventors: Shine Chung; Paul G. Emerson, both of San Jose, Calif.

[73] Assignee: Hewlett-Packard Company, Palo Alto, Calif.

[21] Appl. No.: 533,133

[22] Filed: Sep. 25, 1995

Related U.S. Application Data

[63] Continuation of Ser. No. 317,986, Oct. 4, 1994, abandoned, which is a continuation of Ser. No. 58,118, May 5, 1993, abandoned.

[51] Int. Cl.$^6$ ............... G11C 11/34; G11C 7/00; G11C 8/00
[52] U.S. Cl. ............... 365/230.05; 365/49; 365/177; 365/189.04
[58] Field of Search ............... 365/230.05, 189.04, 365/49, 177, 189.01

[56] References Cited

U.S. PATENT DOCUMENTS

| | | | |
|---|---|---|---|
| 4,491,937 | 1/1985 | Chan | 365/154 |
| 4,535,428 | 8/1985 | Furman | 365/230 |
| 4,558,433 | 12/1985 | Bernstein | 365/189 |
| 4,623,990 | 11/1986 | Allen et al. | 365/189 |
| 4,777,588 | 10/1988 | Case et al. | 364/200 |
| 4,833,648 | 5/1989 | Scharrer et al. | 365/189.05 |
| 4,879,683 | 11/1989 | Garcia | 365/189.05 |
| 4,995,001 | 2/1991 | Dawson et al. | 365/190 X |
| 5,197,035 | 3/1993 | Ito | 365/230.05 |
| 5,247,649 | 9/1993 | Bandoh | 365/230.05 X |
| 5,299,158 | 3/1994 | Mason et al. | 365/189.04 |

FOREIGN PATENT DOCUMENTS

| | | |
|---|---|---|
| 59-22290 | 2/1984 | Japan . |
| 62-285296 | 12/1987 | Japan . |
| WO92/08230 | 5/1992 | WIPO . |

OTHER PUBLICATIONS

Jolly, Richard D.; "A 9-ns, 1.4-Gigabyte/s, 17-Ported CMOS Register File" IEEE Journal of Solid-State Cirucuits, vol.26, No. 10, Oct. 1991, pp. 1407-1412.

Abu-Nofal; "A. Three-Million-Transistor Microprocessor", 1992 IEEE International Solid -State Circuits Conference, Feb. 20, 1992, pp. 108-109.

Nishii et al.; "A 1,000MIPS BiCMOS Microprocessor with Superscaler Architecture", 1992 IEEE International Solid -State Circuits Conference, Feb. 20, 1992, pp. 114-115.

"Asymmetrical Register File Cell with Islation from Read Bit Lines", IBM Technical Disclosure Bulletin, vol. 32, No. 6A, Nov. 1989.

*Primary Examiner*—Do Hyun Yoo

[57] ABSTRACT

An improved memory type multi-ported data storage device is disclosed. The storage device operates to overcome the cell stability problems associated with the prior art by unidirectionally isolating memory cells of the multi-ported data storage device from read ports of the multi-ported data storage device. The unidirectional isolation operates to prevent external signals from the read ports and read port loading from influencing data stored in the memory cells, but continues to allow the memory cells to be read by the read ports associated therewith. The improved multi-ported data storage device not only allows simultaneous access to its memory cells by a large number of read ports without fear that cell stability will cause corruption of the memory cells, but also requires only a minimal amount of additional die area. Moreover, access time is independent of the number of ports being simultaneously accessed.

7 Claims, 6 Drawing Sheets

MULTI-PORTED DATA STORAGE DEVICE WITH IMPROVED CELL STABILITY

CROSS REFERENCE TO RELATED APPLICATON(S)

This is a continuation of application Ser. No. 08/317,986 filed on Oct. 4, 1994, now abandoned and which is a continuation of 58,118, May 5, 1993, abandoned.

BACKGROUND OF THE INVENTION

1. Field of the Invention

The present invention relates to data storage devices and, more particularly, to multi-ported data storage devices which support simultaneous read and write operations.

2. Description of the Related Art

Recently, multi-access common storage devices have become the data storage device of choice for processing systems (e.g., microprocessors) having multiple functional units. Multi-access common data storage devices are more commonly known as multi-ported register files or scratch pad registers. Typically, a multi-ported register file is located within the same integrated circuit chip as the processor. The multi-ported register file is normally best used as a temporary, high-speed data storage area.

Although other data storage architectures, such as local memory for each functional unit or shared memory across a bus, could be used to provide on-chip data storage, multi-ported register files offer an architectural solution which is faster and simpler to implement than either shared memory access across a data bus or local memory for each functional unit. Accordingly, multi-ported register files are presently preferred for on-chip, temporary, high-speed data storage.

Multi-ported register files are particularly suited for use as data storage devices for processors having multiple functional units because they enable all the functional units of a processor to simultaneously access the memory cells within the multi-ported file register. Since all the functional units of a processor are permitted to simultaneously access the multi-ported register file, the processor is able to achieve high computation rates.

In general, as the processing power of a processor increases, the number of functional units tends to increase (e.g., superscalar processors). Moreover, the word size also becomes wider and the cycle time tends to decrease as processors become more advanced. As a result, greater demands are placed on the multi-ported register file. To satisfy these ever increasing demands, the multi-ported register file must not only become wider and deeper but also support more ports.

Currently, there exists two known designs for multi-ported register files. One design is based on multiple input/output flip-flop or latch type storage cells. The other design is based on multiple input/output or write/read port memory (SRAM) storage cells.

FIG. 1A illustrates a single memory cell of a latch type multi-ported register file associated with the prior art. Although only a single memory cell is shown, it should be understood that identical memory cells will be present for each bit of each word within the multi-ported register file.

In FIG. 1A, the multi-ported register file includes a memory cell 10 which consists of two cross-coupled inverters 12a and 12b. The inverter 12a has a larger device size than does the inverter 12b. One side of the memory cell 10 contains write ports, while the other side contains read ports.

On the side of the read ports, the memory cell 10 is connected to an inverter 13 which serves as a buffering device. Each of the write ports consist of a pass gate 14, and each of the read ports consist of a pass gate 16. The gate terminals of the pass gates 14 are connected to write word lines (WWL), the drain (source) terminals of the pass gates 14 are connected to word bit lines (WBL), and the source (drain) terminals of the pass gates 14 are connected to the write side of the memory cell 10. The gate terminals of the pass gates 16 are connected to read word lines (RWL), the drain (source) terminals of the pass gate 16 are connected to read bit lines (RBL), and the source (drain) terminals of the pass gate 16 are connected to the read side of the memory cell 10 via the inverter 13.

When a bit is to be written into the memory cell 10, the appropriate bit is provided to the pass gate 14 via the corresponding word bit line (WBL), then at the appropriate time the write word line (WWL) will activate the gate terminal of the pass gate 14 so as to pass the bit from the word bit line (WBL) to the memory cell 10 for storage. The read port operates in a similar fashion. The only difference being that when the read word line (RWL) activates the gate terminal of the pass gate 16, the pass gate 16 passes the bit stored in the memory cell 10 (as inverted by the inverter 13) to the read bit line (RBL) of the same read port.

FIG. 1B illustrates a single memory cell of a SRAM based memory type multi-ported register file associated with the prior art. In this case, the inverters 12 are symmetrical. In FIG. 1B, the gate terminals of the pass gates 14 and 16 are connected to a word line (WL). The drain (source) terminals of each of the pass gates 14 are connected to a bit line (BL), and the source (drain) terminals of each of the pass gates 14 are connected to the left side of the memory cell 10. The drain (source) terminals of each of the pass gates 16 are connected to an inverted bit line ($\overline{BL}$, and the source (drain) terminals of the pass gate 16 are connected to the right side of the memory cell 10. Hence, the bit line (BL) and the inverted bit line ($\overline{BL}$) are shared by the read ports and the write ports. Unlike the latch type design, in the SRAM memory type design data is read from the memory cell by sense amplifiers (not shown) via the pass gates 14 and 16.

The latch design, although useful for a small number of ports, is impracticable for today's multi-ported register files (which would exceed 16 ports in some superscalar designs) because this design requires too much die area and its performance is relatively slow compared to a SRAM based memory cell design.

Although the SRAM based memory cell design offers sufficient speed and utilizes minimal die area, the memory design has a cell stability problem which is difficult to resolve. In multi-ported register files having only a few ports, the cell stability problem is less significant. However, as the number of ports in register files continues to grow geometrically, cell stability becomes a serious concern that cannot be ignored for memory designs.

Cell stability during read operations is a major consideration in the design of SRAM based memory type multi-ported register files. The stability of memory cells are at risk during read operations because bit lines could potentially overwrite a stored bit in the memory cell during read operations if both read bit line levels are not high enough prior to access. When the memory design is used for the multi-ported register file, cell stability is of particular concern because the pull down to pass gate size ratio (a leading indicator for cell stability) will be different depending on how many ports are accessed at the same time. If the pull down to pass gate size ratio is optimized for single port access, it could cause cell instability when multiple ports are accessed. However, if it is optimized for multiple port access, the access time to the memory cells is slowed significantly. Capacitive cross coupling between bit lines and multiple port accessing can also degrade cell stability.

Access time to the memory cells is also a major consideration in the design of multi-ported register files. Simultaneous multiple port accesses will slow access time in the conventional latch and memory type multi-ported register files. In addition, in the conventional designs, the access time varies with the number of ports which simultaneously access a memory cell.

One known solution to the cell stability problem has been used with a multi-ported register file having 17 ports to ensure sufficient bit line precharge levels. This solution has the disadvantages of requiring additional precharge pulse generation circuitry which will generate a lot of noise that further complicates the cell stability problem. This solution is more fully described in Jolly, "A 9-ns, 1.4 Gigabyte/s, 17-Ported CMOS Register File," IEEE Journal of Solid-State Circuits, Vol. 26, No. 10, October 1991, which is hereby incorporated by reference.

Another known solution uses tri-state buffers (each of which is composed of several transistors) to buffer and completely isolate bit lines. An example of this approach is described in WIPO international publication number WO 92/08230, entitled "High-speed Five-ported Register File having Simultaneous Read and Write Capability and High Tolerance to Clock Skew" and published on May 14, 1992. This solution, however, was used in a latch design and required too much die area to form all the tri-state buffers included in the design. Namely, using tri-state buffers to buffer and completely isolate bit lines requires an excessive number of transistors which are not required for proper performance. These additional transistors take up precious die space and reduce the speed of the register file.

Thus, there is a need for a multi-ported register file design which eliminates the cell stability and access timing problems, yet utilizes only a minimal amount of additional die area and continues to satisfy the speed requirements of processors.

SUMMARY OF THE INVENTION

Broadly speaking, the invention unidirectionally isolates memory cells of a multi-ported data storage device from read ports of the multi-ported data storage device.

In a basic embodiment of the invention, a multi-ported data storage device is provided with a unidirectional isolation unit for each read port. Each unidirectional isolation unit is connected between a memory cell and one of the read ports. The unidirectional isolation units prevent external signals from the read ports from influencing data stored in the memory cell yet continue to allow the memory cell to be read by the read ports associated therewith. Furthermore, the unidirectional isolation units prevent capacitive coupling between bit lines and ensure a small, constant access time.

Preferably, each unidirectional isolation unit includes a single semiconductor switching device which can be implemented in a number of different technologies. For example, each of the unidirectional isolation units may consists of a single transistor (e.g., field-effect transistor or bipolar transistor) which unidirectionally isolates one of the read bit lines associated from one of the memory cells.

An important advantage of the invention is that it overcomes the cell stability problem associated with the prior art. As a result, a multi-ported data storage device can allow simultaneous access to its memory cells by a large number of read ports without fear that cell stability will cause corruption of the memory cells. Since the invention causes the access time to a memory cell to be independent of the number of simultaneous multiple port accesses, the invention also overcomes the access timing problem associated with the prior art. Further, the invention neither degrades the fast speed of memory-type multi-ported data storage devices, nor requires a burdensome amount of additional die area.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 2–6. However, those skilled in the art will readily appreciate that the detailed description given herein with respect to these figures is for explanatory purposes as the invention extends beyond these limited embodiments.

The invention relates to an improved multi-ported memory type data storage device which overcomes both the cell stability problem and the access timing problem of prior art designs. Memory cells become stable and access time becomes independent of the number of simultaneous multiple port assesses. In achieving cell stability and constant access times, the improved multi-ported data storage device retains the advantages of memory type designs, namely small die area requirements and high speed.

Figure 2:
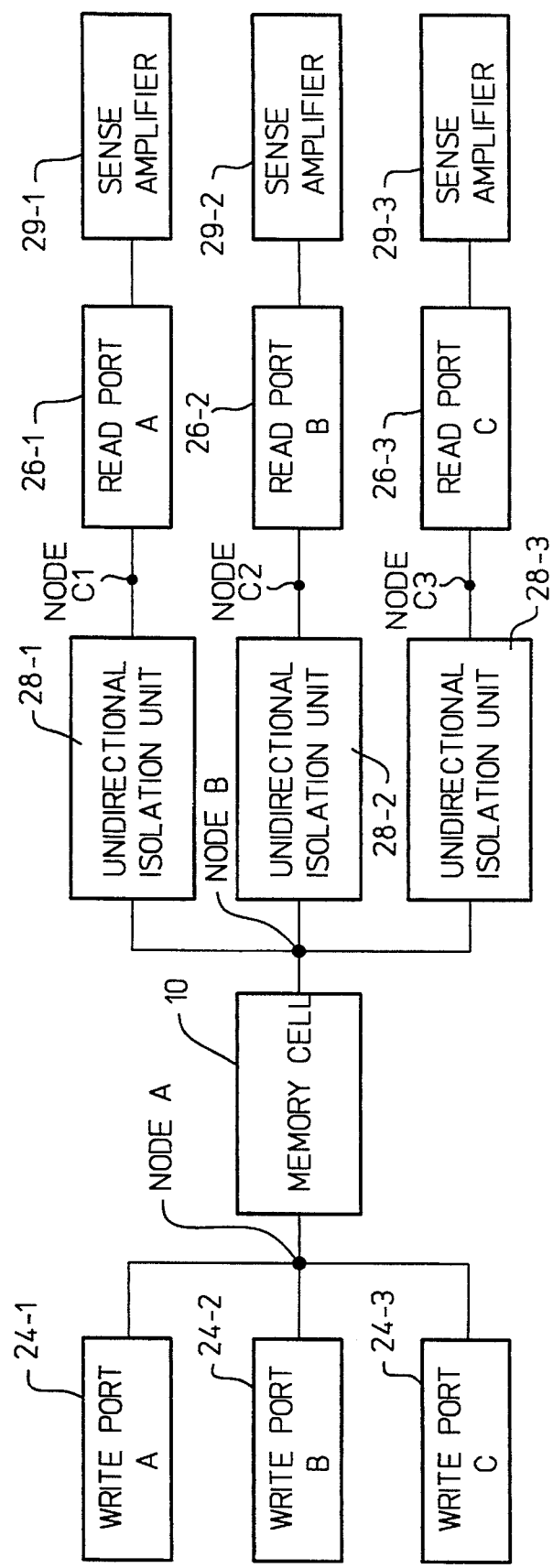
FIG. 2 is a block diagram of a basic embodiment of the invention.

FIG. 2 is a block diagram of a basic embodiment of a multi-ported storage device according to the invention. A memory cell 10 is connected to write ports 24 and read ports 26. The multi-ported storage device shown in FIG. 2 contains six ports, namely write ports 24-1, 24-2 and 24-3 and read ports 26-1, 26-2 and 26-3. Those skilled in the art will recognize that the number of ports supported by the storage device can vary considerably depending on the resources needed and the performance desired.

The write ports 24 are connected to the memory cell 10 at an internal node A. The read ports 26 are connected to the memory cell 10 only through unidirectional isolation units 28. Each read port 26-1, 26-2 and 26-3 has a separate unidirectional isolation unit 28-1, 28-2 and 28-3 between the memory cell 10 and the respective read port 26. All the unidirectional isolation units 28 connect to the memory cell 10 at an internal node B and each of the unidirectional isolation units 28-1, 28-2 and 28-3 connect to one of the read ports 26-1, 26-2 and 26-3 at internal (or intermediate) nodes C1, C2 and C3, respectively. The data is read by supplying it to one or more of the read ports 26 (via respective unidirectional isolation units) and sensing the data using sense amplifiers 29. Each read port 26-1, 26-2 and 26-3 has a sense amplifier 29-1, 29-2 and 29-3 associated therewith.

Each of the unidirectional isolation units 28 functions to prevent a read bit line associated with the respective read port 26 from interfering with the data stored in the memory cell 10, yet allows the memory cell 10 to be read. More specifically, each of the unidirectional isolation units 28 provides only unidirectional isolation in that the memory cell 10 can affect read bit lines (RBL) associated with the read ports 26. For example, a read bit line (RBL) can be pulled low or not depending on whether the bit stored in the memory cell 10 is a 1 or 0. On the other hand, unlike the prior art device shown in FIG. 1B, the signals contained on the read bit lines (RBL) associated with the read ports 26 cannot affect the data stored in the memory cell 10.

Thus, the unidirectional isolation units 28 ensure that data stored in the memory cell 10 is no longer subject to the risk of being corrupted during read operations. Moreover, by individually isolating each bit line with a separate unidirectional isolation unit 28, the invention ensures that access time is independent of the number of read ports simultaneous accessing a memory cell.

Figure 3:
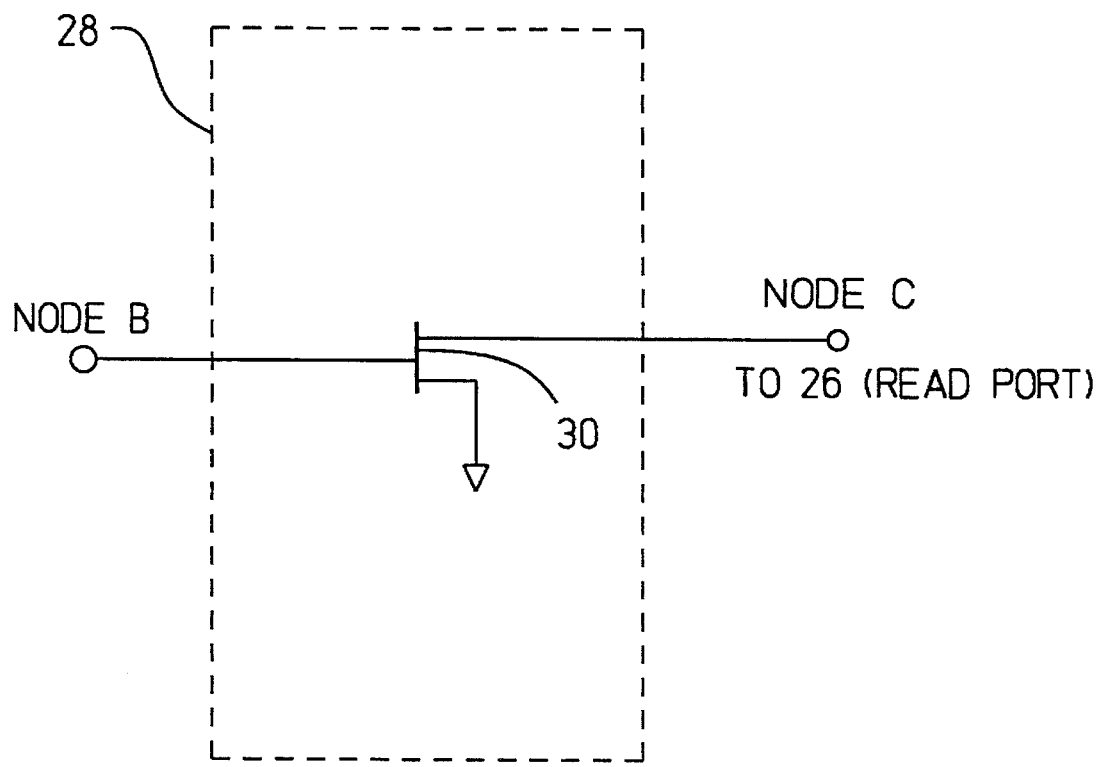
FIG. 3 is a schematic diagram of an implementation of a unidirectional isolation unit.

Although FIG. 2 illustrates unidirectional isolation units 28 as separate elements which correspond one-to-one to the read ports 26, the unidirectional isolation units 28 could be incorporated within the read ports 26. As shown in FIG. 3, each unidirectional isolation unit 28 preferably includes a single switching device 30 which may be constructed of various semiconductor technologies. For example, the switching device may be a field-effect transistor (FET), a metal-oxide-semiconductor field-effect transistors (MOS-FET), a bipolar transistor and the like.

Figure 4:
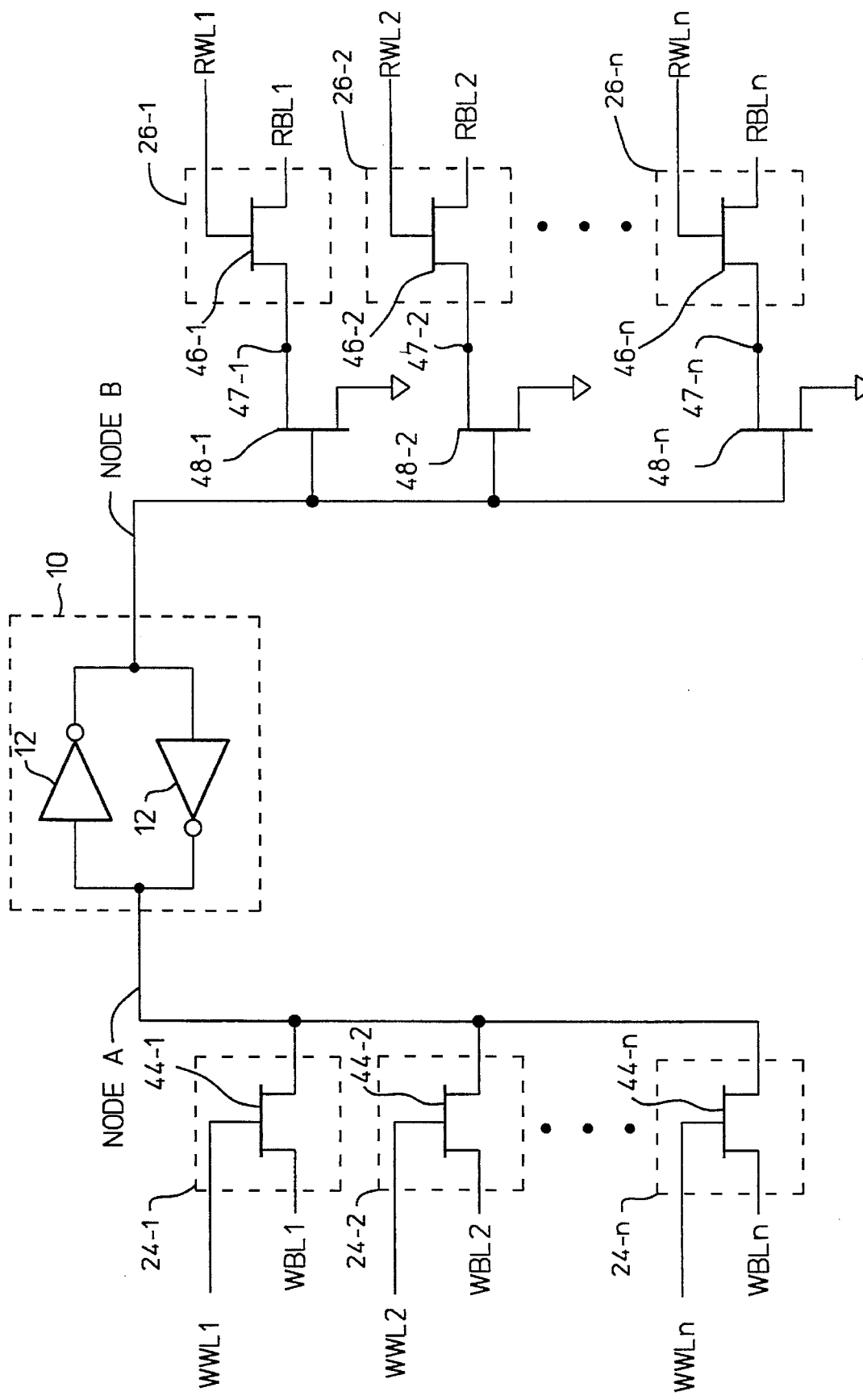
FIG. 4 is a schematic diagram of a detailed embodiment of the invention.

FIG. 4 is a schematic diagram of a detailed embodiment of the invention. In this embodiment, the multi-ported storage device includes, for each memory cell 10, n read ports, n write ports and n unidirectional isolation devices 48. One isolation device 48 is provided for each of the read ports 26. As shown in FIG. 4, read port 26-1 (represented by switching device 46-1) is connected to the internal node B via the isolation device 48-1, the read port 26-2 (represented by switching device 46-2) is connected to the internal node B via the isolation device 48-2, and the read port 26-n (represented by switching device 46-n) is connected to the internal node B via the isolation device 48-n.

More particularly, in FIG. 4, the switching device 46-1 is connected to an intermediate node 47-1 which is connected to the isolation device 48-1. Similarly, switching devices 46-2 and 46-n are connected to internal nodes 47-2 and 47-3, respectively. These internal nodes are further connected to the isolation devices 48-2 and 48-n, respectively.

More particularly, in FIG. 4, the memory cell 10 includes cross-coupled inverters 12 which are coupled at the internal nodes A and B. Each write port 24 includes a pass gate 44 which is activated by a write word line (WWL) to supply a bit on a write bit line (WBL) to the internal node A for storage in the memory cell 10. Thus, the write ports 24 may be functionally the same as those which are known in the art.

Further, with respect to FIG. 4, the read ports 26 include pass gates 46 which are activated by the read word lines (RWL). The gate terminal of each of the isolation gates 48 connects to the internal node B of the memory cell 10. The drain (source) terminal of the isolation gates 48 connect to the source (drain) terminal of the corresponding pass gate 46 via intermediate node 47 of the same read port. On the other hand, the source (drain) terminal of the isolation gates 48 connects to ground.

Once activated, each of the pass gates 46 supplies data from one of the isolation gates 48 to a corresponding read bit line (RBL). The isolation gates 48 allow the bit stored in the memory cell 10 (the internal node B) to influence the value on the read bit line (RBL), but prevent signals on the read bit line (RBL) from influencing the signals at the internal node B of the memory cell 10.

For example, whenever the voltage level of the internal node B of the memory cell 10 changes, the voltage supplied to the gate terminal of the isolation gate 48-1 also changes since it is connected thereto. As a result, the output of the isolation gate 48-1 is pulled low or not. The voltage output of the isolation gate 48-1 is supplied to the read port 26-1. Thereafter, when the read word line (RWL1) activates the gate terminal of the pass gate 46-1, the read bit line (RBL1) is either pulled low or not depending on the voltage level supplied by the isolation gate 48-1. The signals on the read bit line (RBL1) cannot influence the voltage level of the internal node B of the memory cell 10 (except by a trivial extent like capacitance coupling).

In FIG. 4, the isolation gates 48 are illustrated as being separate devices which are associated with individual read ports 26 on a one-to-one basis. However, those skilled in the art will recognize that the isolation gates 48 may be integrated within the read ports 26.

Figure 5:
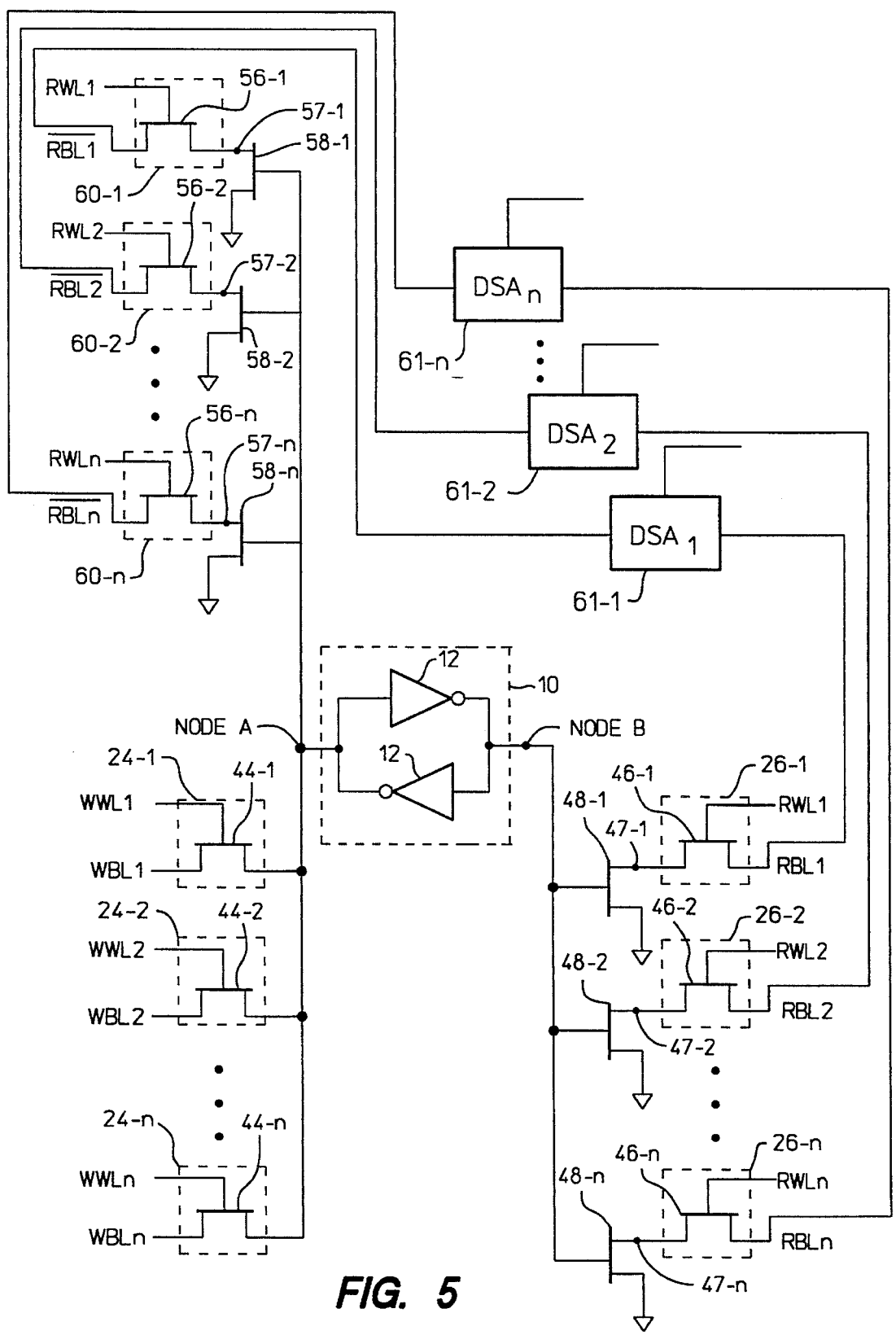
FIG. 5 is a detailed schematic diagram illustrating a modification of the implementation of the multi-ported data storage device illustrated in FIG. 4.

FIG. 5 is a detailed schematic diagram illustrating a modification of the implementation of the multi-ported storage device illustrated in FIG. 4. FIG. 5 illustrates a differential bit line scheme to improve the speed of read operations. Namely, the read bit lines (RBL) together with their inverted read bit lines ($\overline{RBL}$) are connected to a differential sense amplifiers 61-1, 61-2, and 61-n, respectively to double the voltage sensitivity. To provide the differential sensing, additional circuitry is connected to the internal node A of the memory cell 10 of the multi-ported storage device. This additional circuitry 57, 58 is a mirror image of the pass gates 46, intermediate node 47, and the isolation gates 48 shown in FIG. 4, except that inverted read bit lines ($\overline{RBL}$) are used. Hence, FIG. 5 is a double read port design with read ports 26 and 60.

Figure 1A:
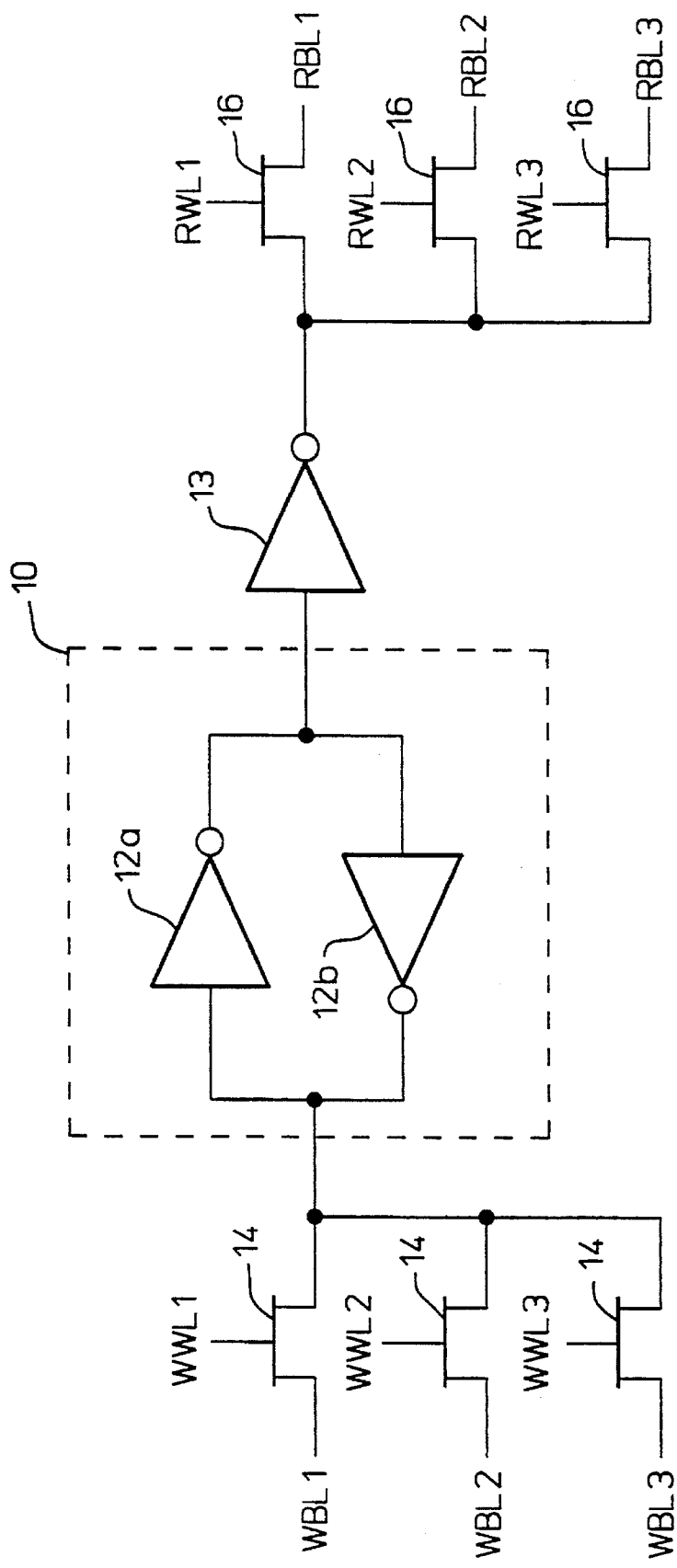
FIGS. 1A and 1B are schematic diagrams of examples of known multi-ported register files.
Figure 1B:
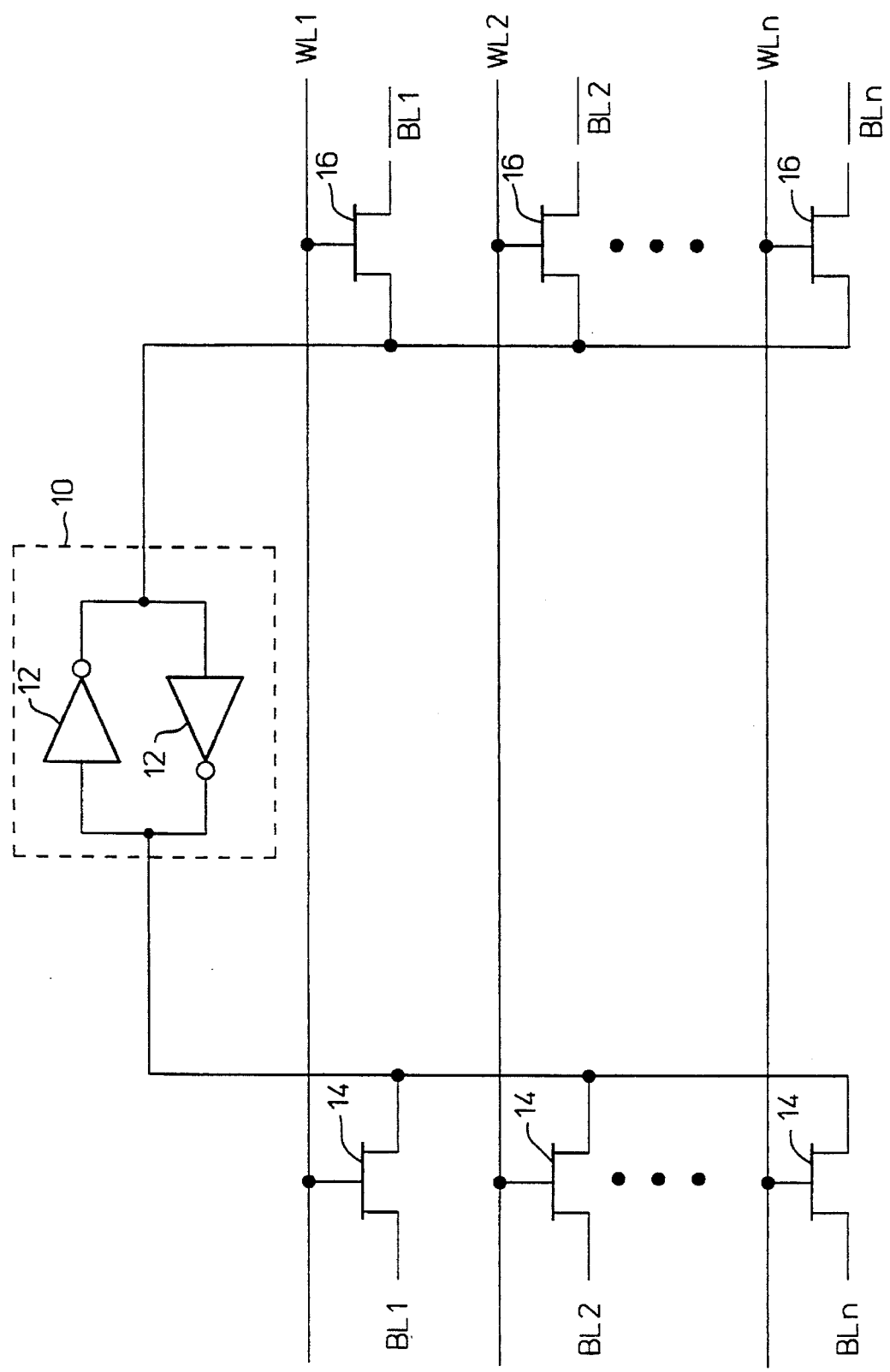

The speed of the multi-ported storage device of the invention is able to continue to operate at the same speed for single port access as the known device shown in FIG. 1B. Comparing FIG. 4 with FIG. 1B, the addition of the isolation gates 48 adds no delay to the read operations because the output of the isolation gates 48 is set upon change of the voltage level of the memory cell 10 so that by the time the pass gates 46 of the read ports 26 are activated by the read word line (RWL) for a read operation, the voltage level output by the isolation gate 48 is ready to be read.

Figure 6:
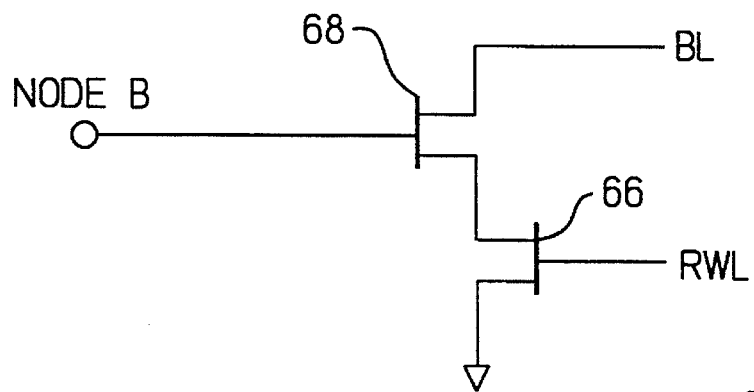
FIG. 6 is a schematic diagram of an alternative implementation of an isolation device together with a read port.

A still further implementation may replace the isolation gate 48 and pass gate 46 with a pass gate 66 and an isolation gate 68 as illustrated in FIG. 6. Although this design is similar in function to that shown in FIG. 4, the gates are connected differently. As result, a multi-ported storage device using this implementation would function slowly (relatively speaking) because the output of isolation gate 68 needs to be discharged as bit line discharge, whereas in the implementation of FIG. 4 the output of isolation gate 48 is already discharged to ground when node B is high.

The invention provides unidirectional electrical isolation of multiple read ports, with minimal increase in die area and minimal, if any, decrease in performance. Moreover, cell stability is not affected by the number of ports simultaneously accessed, and the access time is small and constant and not a function of the number of ports being simultaneously accessed. Further, the invention is equally applicable to either single-ended or differential sensing of the stored data value of the memory cell.

The multi-ported storage device according to the invention can be used with a variety of memory technologies such as SRAM, DRAM, ROM, EPROM, EEPROM or flash memory. The pass gates and the isolation gates may, for example, be FETs or bipolar transistors. Bipolar transistors are probably impracticable due to their size requirements in terms of die area which is a major concern in high density microprocessors.

The many features and advantages of the invention are apparent from the written description and thus it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A multi-ported register file, comprising:

a plurality of memory cells, each of said memory cells having first and second nodes:

a first plurality of write-side switching devices associated with each of said memory cells, each of said first plurality of write-side switching devices, when activated, connecting a different write bit line to the first node of said memory cell associated therewith;

a second plurality of write-side switching devices associated with each of said memory cells, each of said second plurality of write-side switching devices, when activated, connecting a different write-side read bit line to the first node of said memory cell associated therewith;

a plurality of read-side switching devices associated with each of said memory cells, each of said read-side switching devices, when activated, respectively connecting a different read-side read bit line to one of a plurality of read-side intermediate nodes;

a plurality of unidirectional read-side isolation devices, each of said unidirectional read-side isolation devices operatively connecting the second node of one of said memory cells to one of said read-side intermediate nodes, and each of said unidirectional read-side isolation devices comprising a field-effect transistor having a gate terminal connected to the second node of one of said memory cells, a source terminal connected to a fixed voltage source and a drain terminal connected to said one of said read-side intermediate nodes, whereby each of said unidirectional read-side isolation devices substantially prevents one-of the read-side read bit lines from influencing a signal stored at one of said memory cells while enabling the signal stored at said one of said memory cells to influence said one of said read-side intermediate nodes;

a plurality of unidirectional write-side isolation devices, each of said unidirectional write-side isolation devices operatively connecting the first node of one of said memory cells to one of write-side intermediate nodes, and each of said unidirectional write-side isolation devices comprising a field-effect transistor having a gate terminal connected to the first node of one of said memory cells, a source terminal connected to the fixed voltage source and a drain terminal connected to said one of said write-side intermediate nodes, whereby each of said unidirectional write-side isolation devices substantially prevents one of the write-side read bit lines from influencing a signal stored at one of said memory cells while enabling the signal stored at said one of said memory cells to influence said one of said write-side intermediate nodes; and a differential sense amplifier connected between said read-side read bit lines and said write-side read bit lines.

2. A multi-ported register file as recited in claim 1, whereby access time to a given one of said memory cells via said read-side switching devices associated therewith is independent of the number of said read-side switching devices simultaneously accessing the given memory cell.

3. A multi-ported register file as recited in claim 1, wherein each of said first and second plurality of write-side switching devices is activated by a different write word line, and each of said read-side switching devices is activated by a different read word line.

4. A multi-ported register file as recited in claim 1, wherein each of said unidirectional read-side isolation devices consists of a single field-effect transistor.

5. A multi-ported register file as recited in claim 1, wherein the fixed voltage source is ground.

6. A multi-ported register file as recited in claim 1, wherein each of said read-side switching devices comprise a field-effect transistor having a gate terminal connected to a read word line, a drain terminal connected to a one of the read-side read bit lines and a source terminal connected to the drain terminal of said unidirectional read-side isolation device corresponding thereto.

7. The multi-ported register file of claim 1, wherein said first plurality of write-side switching devices contains at least three switching devices, said second plurality of write-side switching devices contains at least three switching devices, said plurality of read-side switching devices contains at least three switching devices, said plurality of unidirectional read-side isolation devices contains at least three isolation devices, and said plurality of unidirectional write-side isolation devices contains at least three isolation devices.

\* \* \* \* \*